United States Patent [19]

Bok

[11] Patent Number: 5,017,409
[45] Date of Patent: May 21, 1991

[54] METHOD OF CONFORMAL COATING

[75] Inventor: Hendrik F. Bok, Acushnet, Mass.

[73] Assignee: Union Carbide Chemicals and Plastics Technology Corporation, Danbury, Conn.

[21] Appl. No.: 205,889

[22] Filed: Jun. 13, 1988

[51] Int. Cl.$^5$ ............................................. B05D 1/02
[52] U.S. Cl. .................................. 427/424; 427/421; 239/99; 239/129; 239/568
[58] Field of Search ................ 427/421, 424; 239/101, 239/99, 568, 597, 129

[56] References Cited

U.S. PATENT DOCUMENTS

| | | | |
|---|---|---|---|
| 3,461,840 | 4/1966 | Turner | 118/314 |
| 3,556,411 | 1/1971 | Nord et al. | 239/599 X |
| 3,843,055 | 10/1974 | Nord et al. | 239/599 |
| 3,858,812 | 1/1975 | Williams et al. | 239/599 |
| 3,923,253 | 12/1975 | Stewart | 239/463 |
| 4,207,356 | 6/1980 | Waugh | 427/55 |
| 4,346,849 | 8/1982 | Rood | 239/597 |
| 4,349,947 | 9/1982 | Rood | 29/157 C |
| 4,578,290 | 3/1986 | Komon et al. | 427/421 |
| 4,600,601 | 7/1986 | Tamura | 427/96 |
| 4,698,240 | 10/1987 | Ono et al. | 427/58 |
| 4,753,819 | 6/1988 | Shimada | 427/421 X |

FOREIGN PATENT DOCUMENTS

0230782  5/1987  European Pat. Off. .

Primary Examiner—Shrive Beck
Assistant Examiner—Alain Bashore
Attorney, Agent, or Firm—Paul W. Leuzzi, II

[57] ABSTRACT

Spray coating, particularly flat spray coating of circuit boards. Applicant's method of conformal coating, eliminates "railroading" at the edges of the flat spray web and assures precise control of the amount of coating material placed on the circuit board surface. The method includes longitudinally advancing a pressurized coating over a surface to be coated, while simultaneously feeding the coating in a flat spray pattern, and triggering feeding "ON/OFF" so as to proportion the amount of coating being fed onto the surface and to reduce "fishtail" at the edges of the flat spray pattern.

11 Claims, 10 Drawing Sheets

3 PSI    8 PSI    12 PSI    16 PSI    20 PSI

STEADY OPEN
PATTERN

FIG. 6

66% OPEN
PATTERN

METHOD OF CONFORMAL COATING

BACKGROUND OF THE INVENTION

1. Field of the Invention:

Spray coating, particularly coating of circuit boards. The method of applying conformal coatings onto the component or circuit side of a printed circuit board by means of applying a film of coating material extruded through a pressurized "flat" spray nozzle.

2. Prior Art:

| TURNER | 3,461,840 |
|---|---|
| NORD et al. | 3,556,441 |
| NORD et al. | 3,843,055 |
| WILLIAMS et al. | 3,858,812 |
| STEWART | 3,923,253 |
| WAUGH | 4,207,356 |
| ROOD | 4,346,849 |
| ROOD | 4,349,947 |
| KOMON et al. | 4,578,290 |
| TAMURA | 4,600,601 |
| ONO et al. | 4,698,240 |
| SHIMADA | EP 0230782 |

Being discussed in an accompanying Information Disclosure Statement.

3. Background of the Invention:

Method for conformal coating of circuit boards so as to control discretely the amount of coating material applied in a flat or a flat spray pattern to the circuit board and to prevent railroading or fish tailing at the sides of the pattern. Applicant pressurizes the coating while longitudinally advancing and feeding the coating in a flat spray pattern. The feeding of the coating is triggered "ON" and "OFF", so as to proportion the amount and pattern of coating being fed onto the surface of the circuit board.

Figure 1:
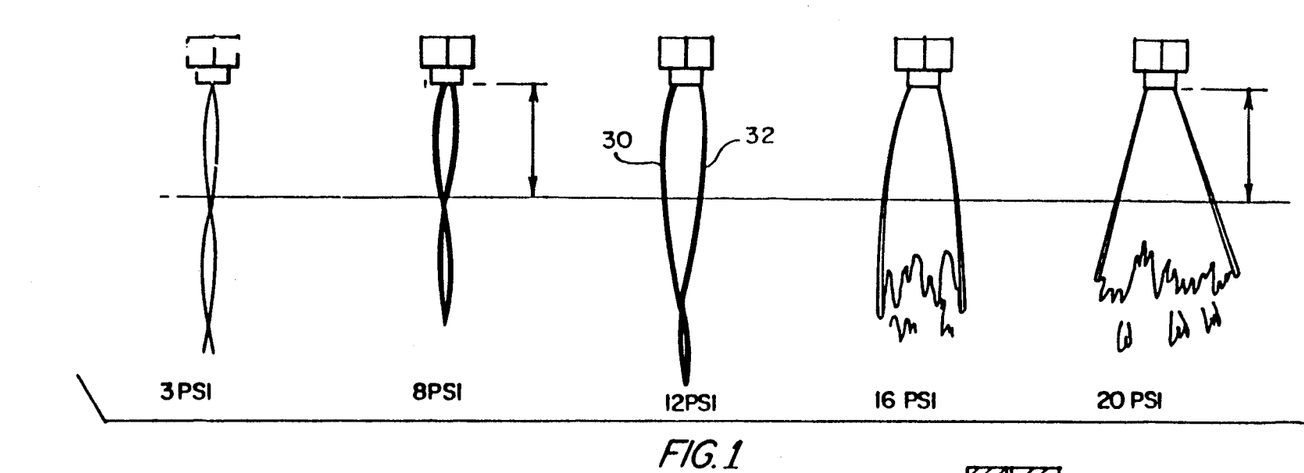
FIG. 1 is a schematic view of flat spray patterns discharged through nozzles at the varying pressures indicated.
Figure 2:
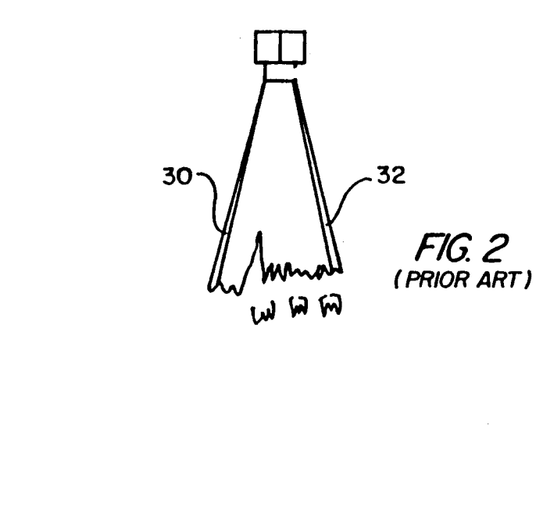
FIG. 2 is a schematic view of a conventional flat spray nozzle designed for hydraulic atomization wherein the film breaks up into globules and "tails" or railroads are formed at the edges of the pattern.
Figure 17:
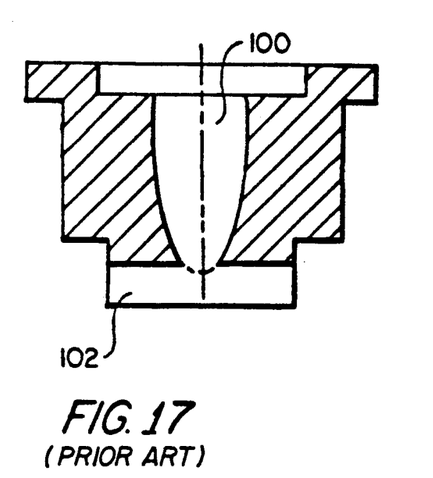
FIG. 17 is a transverse vertical sectional view through a conventional cross cut standard hydraulic spray nozzle taken at right angles to the longitudinal direction of spraying.
Figure 18:
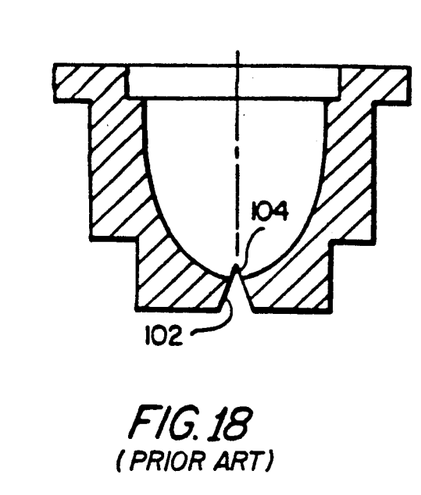
FIG. 18 is a longitudinal sectional view of the conventional nozzle illustrated in FIG. 17.
Figure 19:
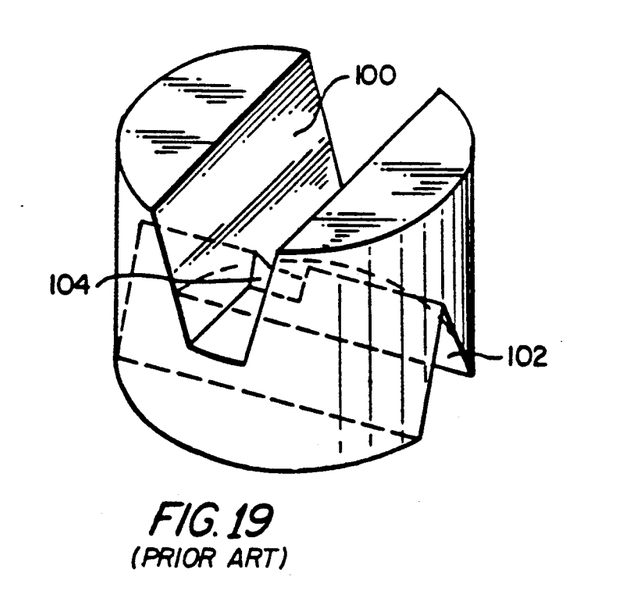
FIG. 19 is a perspective view of the cross cut hydraulic nozzle, of the type illustrated in FIGS. 17 and 18.
Figure 20:
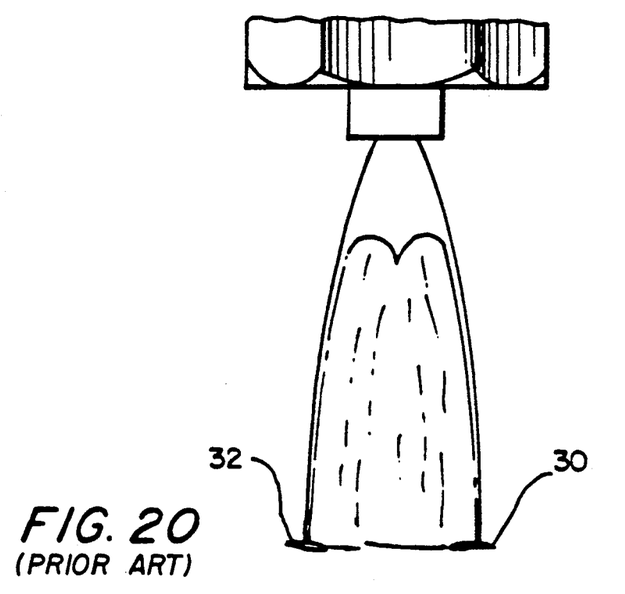
FIG. 20 is a perspective view of a conventional flat spray pattern being fed over a longer distance, as illustrated in FIGS. 2 and 4, and forming fish tails on the surface of the circuit board.

DESCRIPTION OF THE PREFERRED EMBODIMENTS:

A conventional "cross-cut" nozzle capable of developing a flat spray pattern is illustrated in FIGS. 17, 18 and 19. The design of this nozzle includes a rectangular orifice formed by an inverted and truncated groove 100, cutting at orifice 104 into lower V groove 102. The coating material being pushed through orifice 104 will spread out by surface tension across the width of V groove 102, resulting in the formation of a web film at low fluid supply pressures, e.g., 5–30 PSI. The film width is dependent, of course, upon fluid pressure and viscosity, as illustrated in FIG. 1. As illustrated in FIGS. 2 and 20, if the pressures exceed 30 PSI (depending on viscosity, temperature and surface tension), the fluid flow starts to break up upon exiting the orifice.

Figure 4:
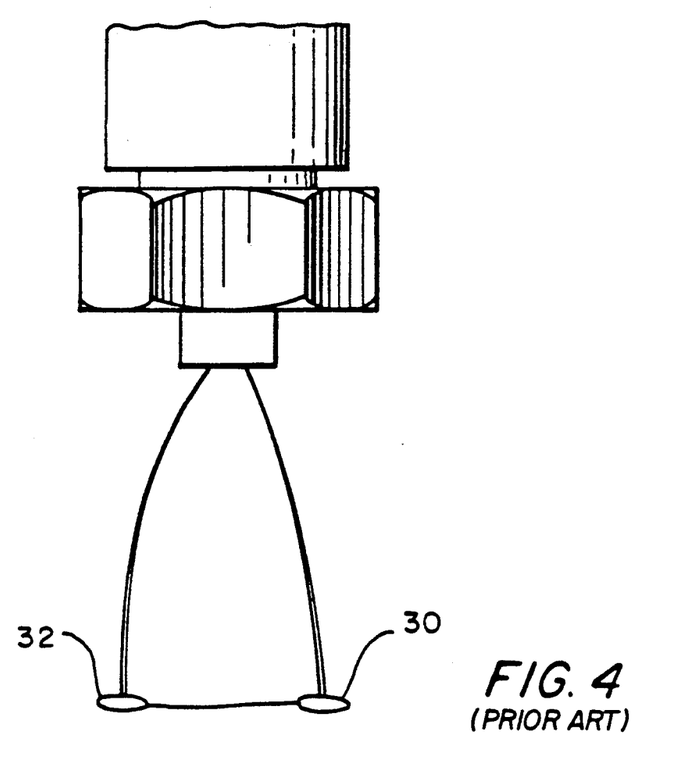
FIG. 4 is a perspective view showing a conventional flat spray or curtain nozzle wherein fishtails or railroading forms at the edges of the pattern.

However, regardless of fluid pressure, conventional flat spray or curtain nozzles form fishtails or ropes 30, 32 at both sides of the web, as illustrated in FIG. 4. The non-laminar transition through the square or rectangular nozzle orifice 104 and the spread of fluid over the length of V groove 102 whereby the fluid encounters the highest surface tension at both ends of V groove 102 results in a flat or curtain film pattern that is extremely thin within the web and with heavy flow at the ends in the form of ropes or tails.

As illustrated in FIGS. 4 and 20, a coating material applied in this manner produces a railroad track effect. FIG. 20 shows the flat spray pattern taught in Nordson EP 0 230 780 film and break up of the film beyond a distance of 1" from the nozzle tip. This again is due to the sharp transition edges of orifice 104, V groove 102 and fluid flow velocity.

The heavy tails at both edges of the similar film pattern illustrated in FIG. 20 cause bubbles in the coating where the adjacent patterns meet in slight overlap 106, as illustrated schematically in FIG. 2. This overlap is needed in order to assure that no surface of the circuit board is left uncoated. Since Nordson's select spray process applies the coating in a one pass application and excessive flow due to higher viscosity is to be avoided, the overlapped areas 106 present a very thick wet coating surface, thus limiting solvent and bubble release from the film. Both of these effects are unacceptable from a quality control point of view.

In order to establish coating flow through an orifice at low enough pressure to prevent atomization, the orifice size may not be much less than 7 mils. With such an orifice size, the minimum fluid output is illustrated in FIG. 1 under different conditions of pressure, viscosity and temperature.

Since the minimum output from the nozzle is not much less than 30 cc/min., and assuming that a ⅜" wide film pattern is applied, an airless spray gun is required to move over the surface of the circuit board at 75-100 ft./min. or 15 to 20 inches per second.

Figure 9:
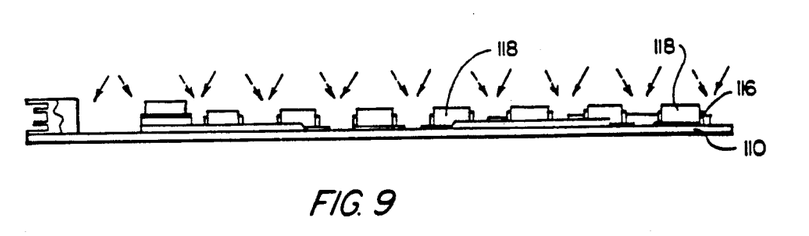
FIG. 9 is an end elevation view of a circuit board.
Figure 10:
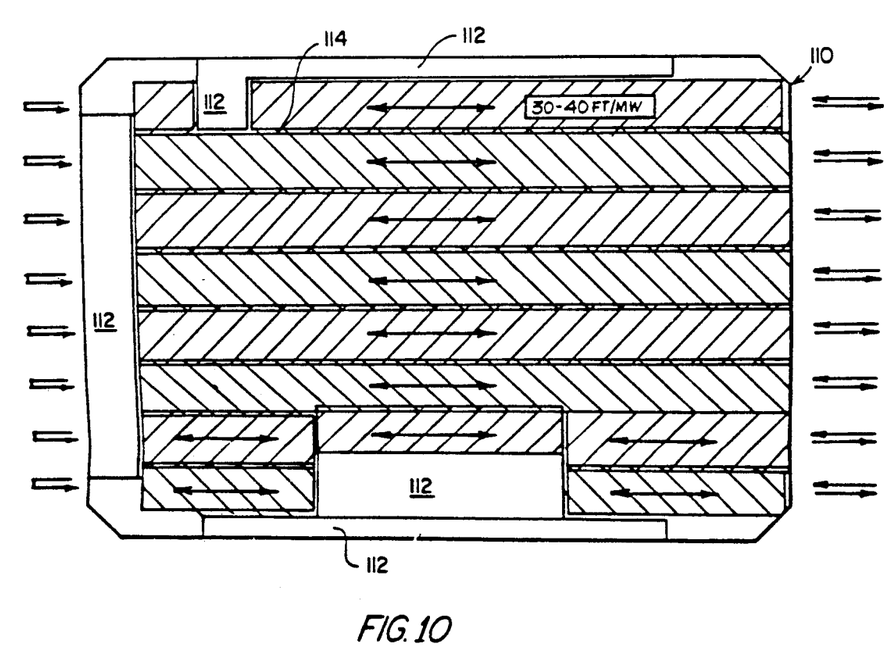
FIG. 10 is a top plan of the circuit board illustrated in FIG. 9 with the directional travel of applicant's spray nozzle indicated by arrows.
Figure 11:
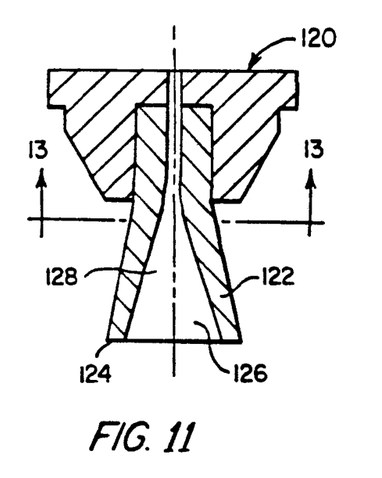
FIG. 11 is a vertical sectional view of applicant's proposed nozzle taken at right angles to the direction of travel of the nozzle.
Figure 12:
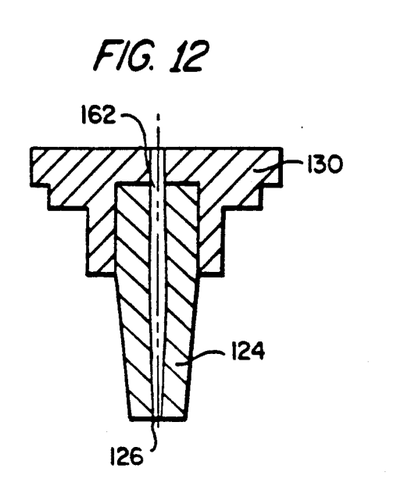
FIG. 12 is a transverse vertical sectional view of applicant's nozzle illustrated in FIG. 11.
Figure 13:
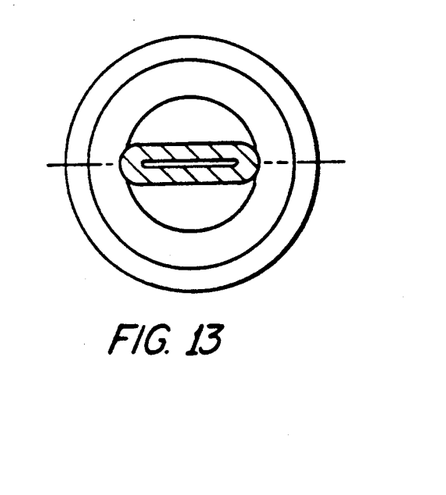
FIG. 13 is a transverse horizontal section, taken along section line 13—13.
Figure 14:
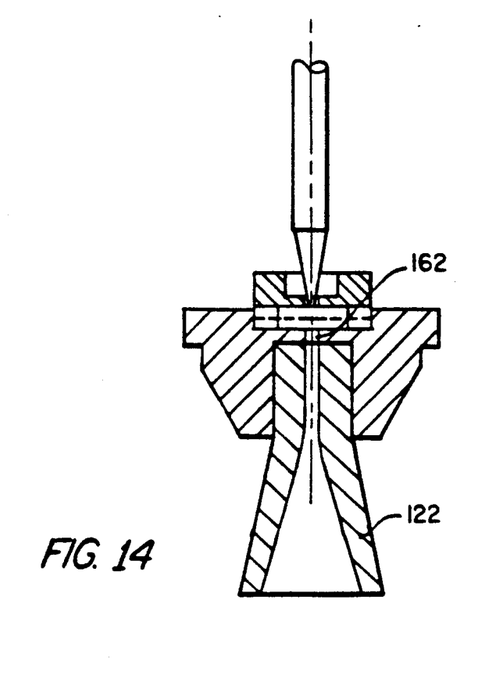
FIG. 14 is a vertical sectional view of the nozzle illustrated in FIG. 11 and showing placement of applicant's nozzle housing and tungsten carbide needle core 132.

FIG. 10 shows the coating pattern applied to a circuit board 110, wherein the blank areas 112 are not to be coated. The spray gun pass starts at the upper right side, moves to the left side of board 110 and then indexes down far enough to allow a slight overlap 114. The coating is then applied from left to right, etc., until the entire board 110 is coated. As illustrated in FIG. 9, a conventional disadvantage of this method of application is the shadowing effect of the pattern not coating the trailing side of the components. Since the spray gun moves per stroke in only one direction, the coating liquid is driven into the leading edge side 116 of the component 118 while also because the film pattern is an inverted V shape, the sides of the components can see some shadowing effect if components such as flat packs 116 are located close together.

As illustrated in FIGS. 11-14, the heart of applicant's coating application system is nozzle 120, designed to produce a web type film of a specific web width. The web is formed by a round orifice tube 122 that is expanded on one side as at 124 and also is formed to produce a flat, wide nozzle mouth 126. Of extreme importance is the laminar transition from a small diameter fluid flow to a flat, ribbon type orifice. The transition is required to be gradual, while the internal surface 128 of the nozzle is of a hydraulically polished character to avoid turbulence of the coating material.

To manufacture such a nozzle, it was found that a glass tube with an inside diameter of 5-12 mils can be formed by heat to the nozzle configuration shown in FIGS. 11-14. The glass when formed by heat meets the requirements as stated above and provides adequate wear resistance. The formed flared nozzle is epoxy glued into nozzle housing 130.

Figure 3:
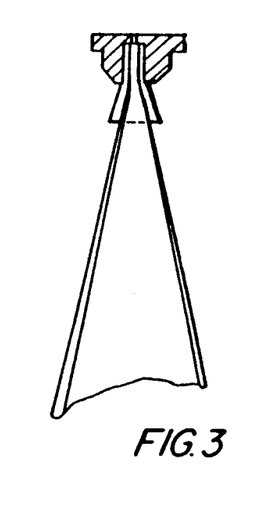
FIG. 3 is a schematic view of applicant's method of conformal coating wherein the film properties are sustained over a longer distance.

The thusly produced film is shown in FIG. 3. As will be apparent, the film properties of a nozzle designed in accordance with applicant's nozzle are thereby sustained over a longer distance as compared to FIG. 2 which is a film produced by a conventional cross-cut type nozzle. As illustrated in FIG. 2, although the width of web of the conventional produced web or flat spray can be substantially wider than in other types of spray patterns, the ropes or trails 30, 32 prevail as well.

The purposes of applicant's method of conformal coating are to prevent the web tails from forming a railroad or fishtail pattern having poor overlap capabilities and, also, to be able to control precisely the amount of coating material placed on the circuit board surface.

The direct benefit of proportioning or conforming the output of the nozzle is the capability of reversing the stroke of the filming nozzle before indexing to an adjacent parallel strip of coating. It is even possible to apply a cross coat or transverse coat to assure that all sides of components are adequately coated and to assure that shadowing is eliminated.

Figure 15:
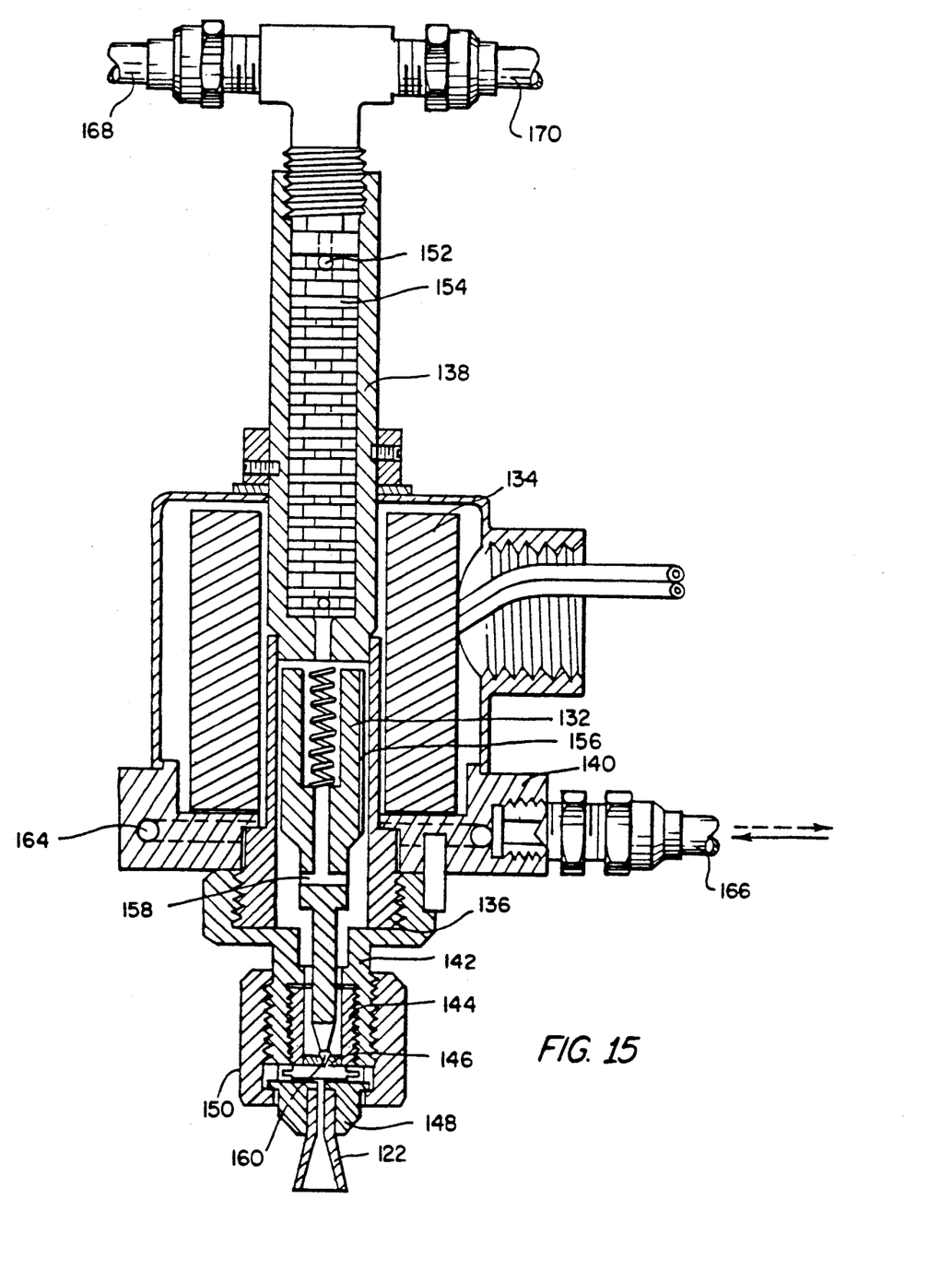
FIG. 15 is a vertical section view of a flat spray pattern triggering gun which may be used in coating, according to the present method.

A suggested film triggering mechanism is illustrated in FIG. 15 and consists of an iron needle core with tungsten tip 132, solenoid 134, actuator stem 126 which is attached by welding, a static mixer and fluid inlet housing 138, heated gun support body 146, nozzle body 142 with orifice retainer 144, tungsten orifice 146 and nozzle housing 148.

Figure 5:
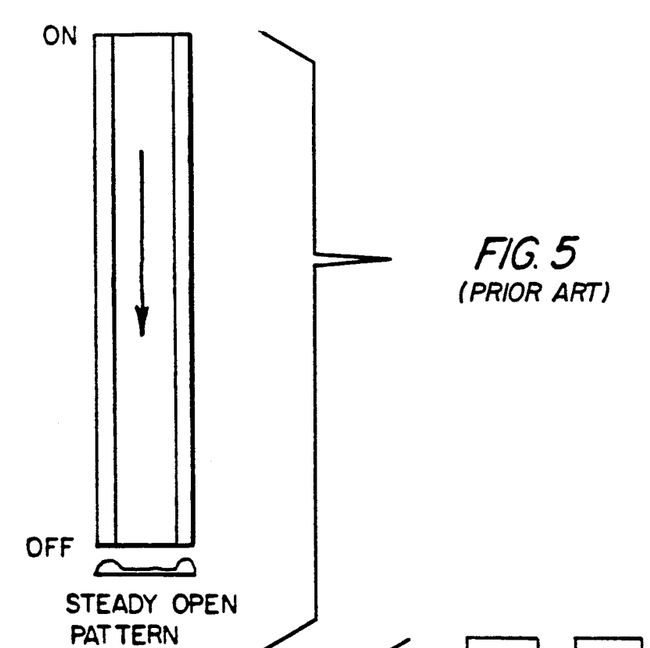
FIG. 5 is a schematic view showing fishtail or railroad pattern formed by steady open operation of a flat spray nozzle such as illustrated in FIGS. 2 and 4.

The needle core/solenoid coil combination allows needle core 132 displacement to respond to an electronic square weave pattern of up to 50 cycles per second. Thus, if the ON signal and OFF signal times are equivalent, then the gun ON time is reduced 50% from the steady gun ON or open pattern illustrated in FIG. 5.

As illustrated in FIG. 15, the coating materials inlet 152 is at the top of the filming gun. The coating flows through the static mixer 154 (optional) and outside the needle core through multiple grooves 156 and spring retaining opening 158 having drilled passages and filling the space above the carbide orifice 148.

Upon moving needle core 132 vertically upward, the coating material flows through orifice 162 to the nozzle tip. Orifice 148 having a diameter larger than the nozzle tip is shut by a tungsten carbide nozzle tip 160 which is tear shaped. Although the opening action of the nozzle tip 160 is extremely fast, the tear shape of the nozzle tip 160 allows a gradual opening and closing of orifice 162.

Figure 6:
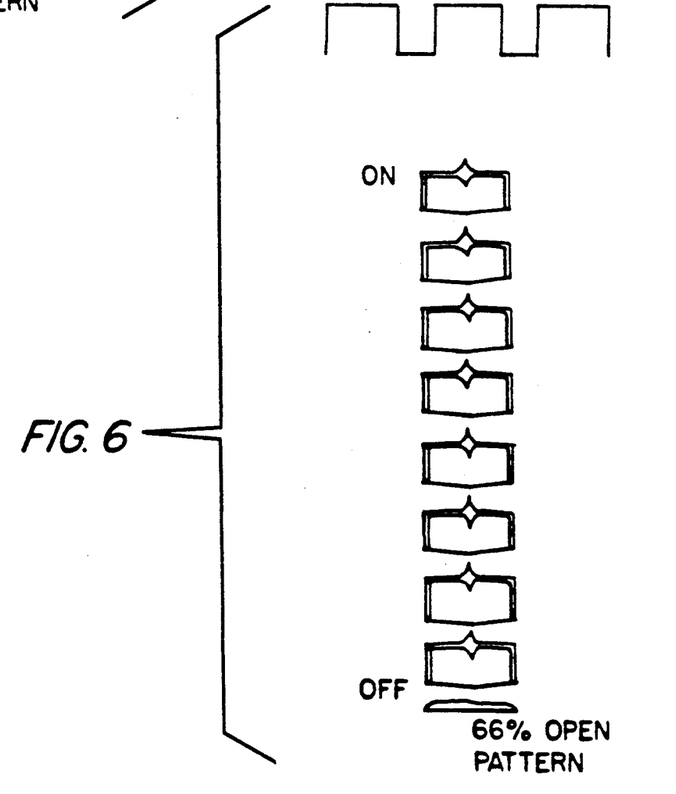
FIG. 6 is a schematic view of applicant's proportional or conformal filming process wherein triggering of feeding of the coating is such that the nozzle is open 66% of the time while, avoiding railroading.
Figure 7:
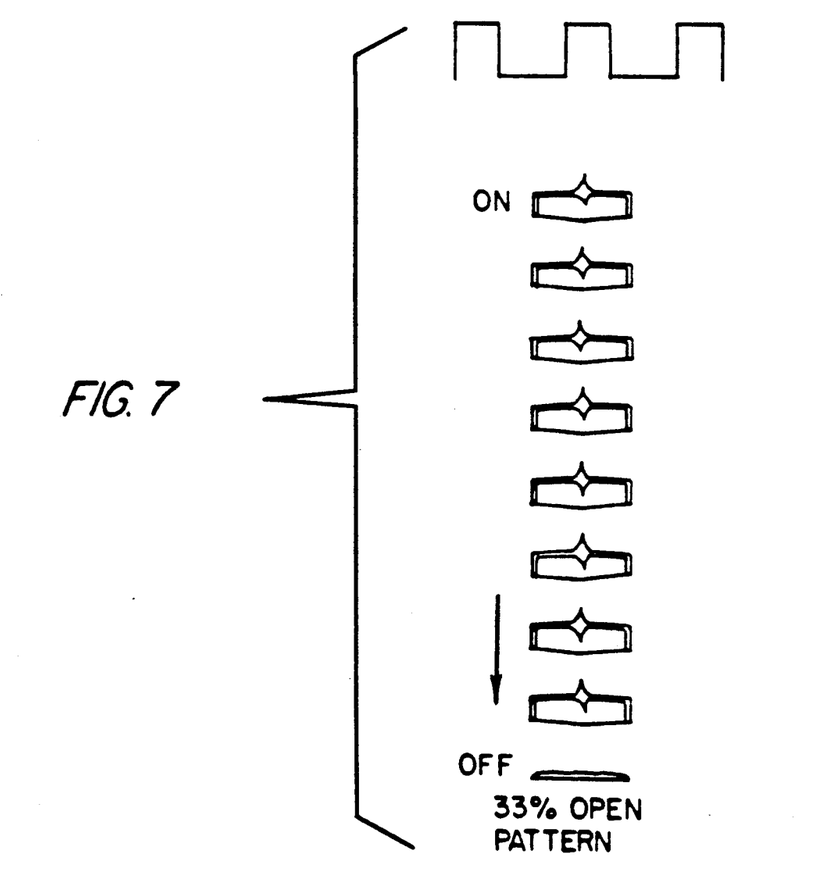
FIG. 7 is a schematic view showing triggering of applicant's feeding in a 33% open mode, while avoiding railroading.

Referring back to FIG. 1, it can be seen that the tails 30, 32 of a flat or curtain pattern run from the center and then outward to the full width of the web during the opening of the nozzle orifice. Equally, the tails move inward when the nozzle is shut off from the coating supply. Therefore, by triggering on/off, applicant's nozzle orifice 162 up to 50 cycles per second as illustrated in FIGS. 6 and 7, the tails will be constantly moving outwardly and inwardly, creating a zipper effect. Since the blobs of coating material flow together after application, the railroad tails have been eliminated.

Since the filming mechanism is triggered by a computer, the ON-OFF actuations can be modified at a given frequency of up to fifty cycles per second. For instance, as illustrated in FIG. 6, the ON time can be two or as much as three times as long as compared to the OFF time. In FIG. 6, the filming output is then 66% of a steady opened nozzle. If, however, the OFF time is two times longer than the ON time, as illustrated in FIG. 7, the output from the nozzle is reduced to 33% of a steady open nozzle. It is preferred to have the triggering "OFF" mode in the range of 25 to 75% of feeding coating.

As illustrated in FIG. 15 and in order to allow coatings of higher solid content, the gun support body 140 is heated by feeding hot water through the inlet and outlet fittings 164, 166, shown in cross-section. The heat thusly accumulated in support body 140 is conducted to the nozzle by the nozzle body 142. In addition, the triggering action of solenoid 134 creates heat which is directed around the lower portion of the static mixer and needle core 132. Manifestly, the heat which is thusly applied to the coating material lowers the viscosity and enhances the filmforming properties at lower pressures.

In FIG. 15, the cross-sectional drawing of the film triggering mechanism details two coating material inlets 168, 170 by way of example for feeding a two part polyurethane or like coating. Inlet 170 might be the catalyst agent to inlet 168 fluid and when mixed and heated would have a short shelf life.

Prior to the actual coating cycle, the gun could be triggered to feed polyurethane through inlet 168, properly blended with feeding of catalyst through inlet 170. Upon a time delay, the gun could start its coating cycle. Upon completion of the coating cycle, the gun could be flushed by interrupting catalyst inlet 170, while continuing feeding of polyurethane through inlet 168 and through the nozzle. After a time delay, 168 could be triggered "OFF".

Polyurethane fluid being fed through inlet 168 fluid without catalyst being fed through inlet 170 can remain in the gun for a longer time, since cross linking will not take place.

Another method of cleaning the internal parts of the gun from coating material is to close off the supply of inlet 168 and inlet 170 and flush with a compatible solvent via a third supply inlet (not illustrated).

Of course, if only a single and easily dissolvable coating material is used, such as an acrylic, then the coating material may remain in the gun. Otherwise a flush cycle of compatible solvent could be used to clean the gun.

Figure 16:
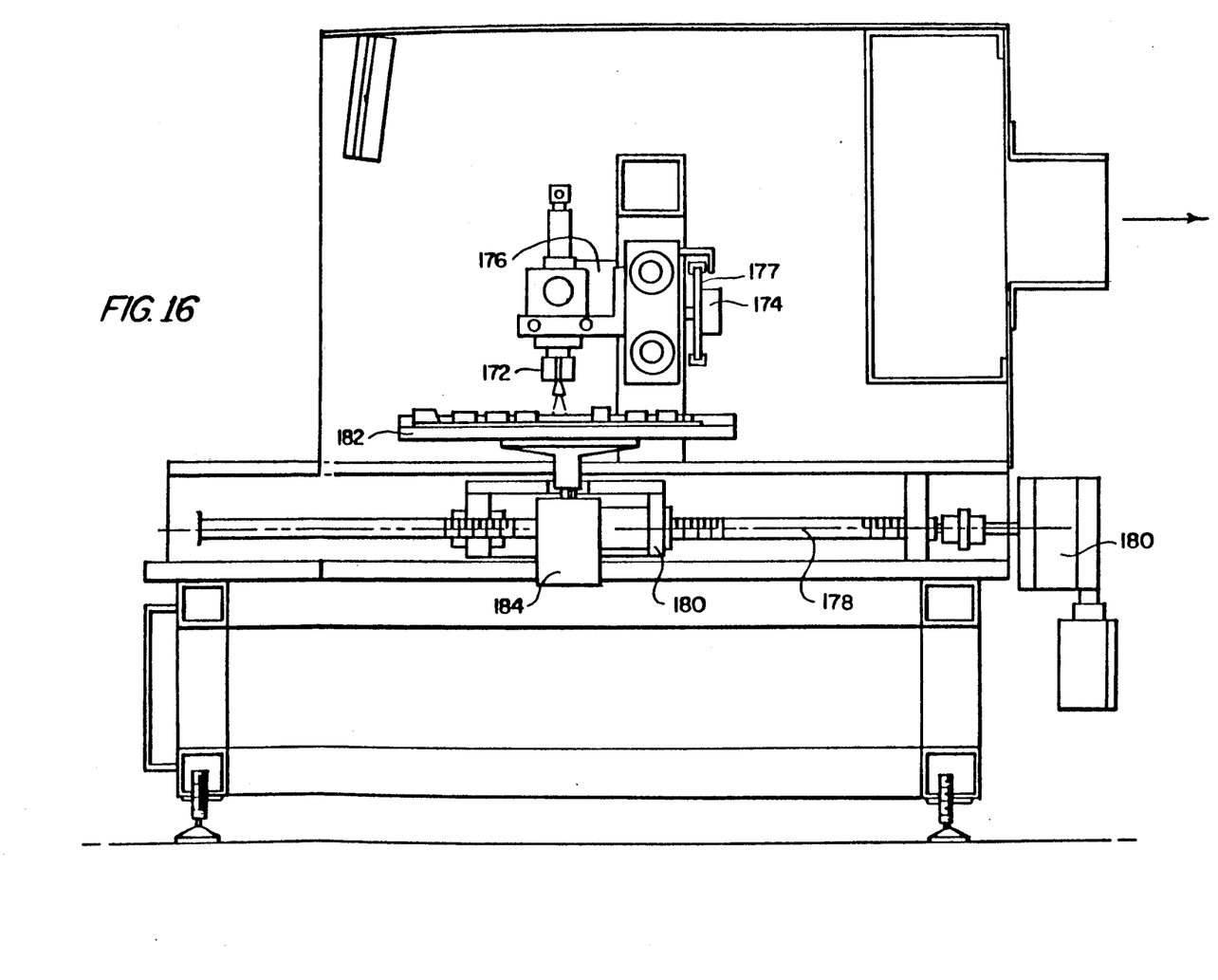
FIG. 16 is a schematic view of a proposed installation for conformal coating of circuit boards according to the present invention and including a turn table support for right angle feeding of the coating onto the circuit board.

A selective conformal coating apparatus is shown in FIG. 16, film triggering gun 172 is attached to a chain driven reciprocating mechanism 174. A stepper motor 176 drives the sprocket 177 of the chain loop and although the reciprocating stroke is fixed, the computer is able to turn the cycling of the film triggering gun ON and OFF via created software. This reciprocating mechanism is the X axis of the apparatus.

The Y axis is created by a screw 178 moving carriage 180. Screw 178 is driven by a stepper motor 180 and is capable of indexing carriage 100. A circuit board support platform 182 is attached to carriage 180 via a 90 degree turn actuator 184. This 90 degree turn actuator 184 is pneumatically activated and would turn the platform 90 degrees to permit a cross coat spraying function.

The X and Y axis are programmed to apply a conformal film coating sequence as shown in FIG. 10.

Figure 8:
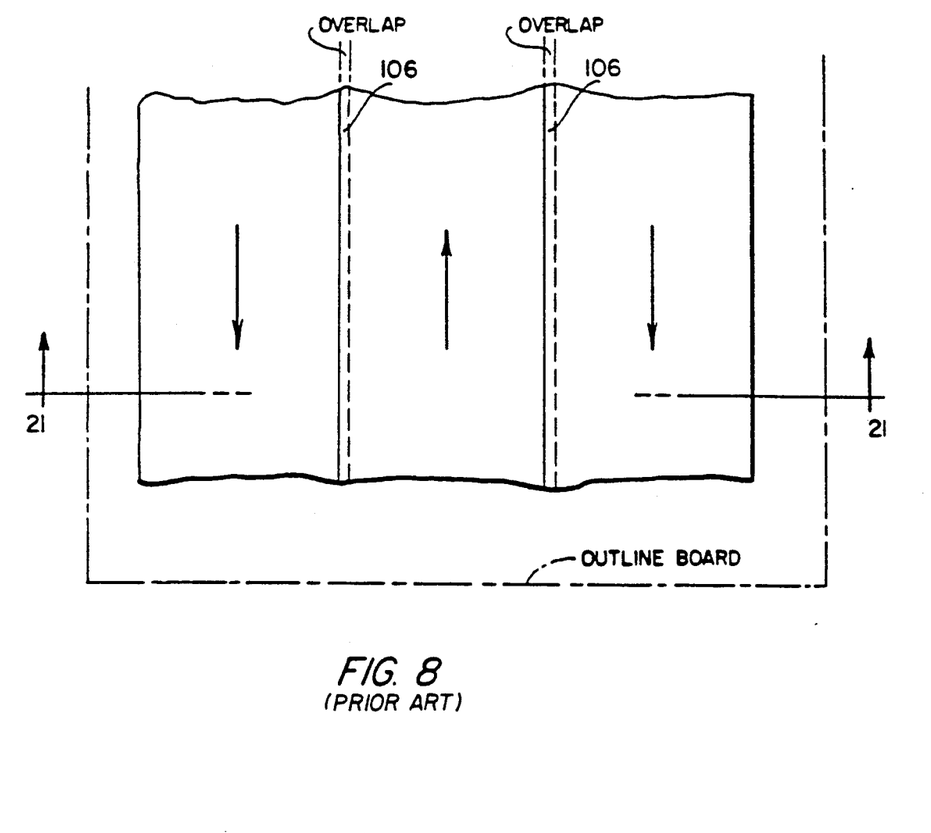
FIG. 8 is a schematic view showing the railroading or fishtailing overlap 106 inherent in flat spray pattern over a circuit board, according to the nozzle illustrated in FIGS. 2 and 4.
Figure 21:
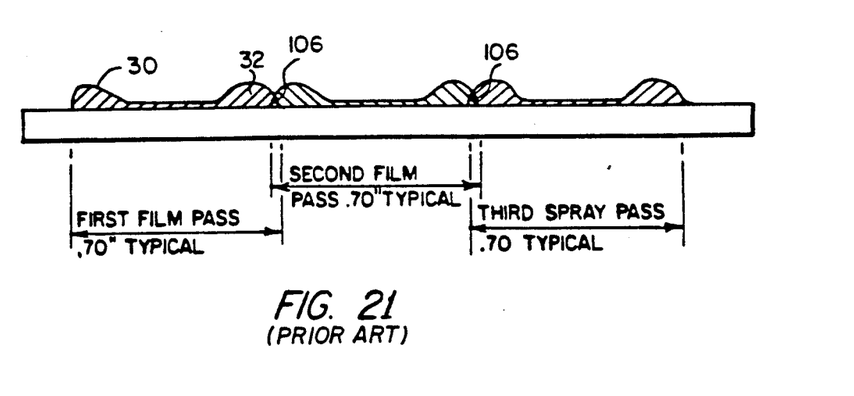
FIG. 21 is a vertical section of circuit board 114 illustrated in FIG. 8 and showing railroading or fishtailing overlap 106 inherent in conventional flat spray pattern coating.

As illustrated in FIG. 9, the double strokes per pass allows the coating to be applied from two sides thus eliminating the conventional shadowing effect 106 of FIGS. 8 and 21.

In the event that printed circuit board 110 is heavily populated with flat packs 118, and the like, as illustrated in FIG. 9, the application of a cross coat might be necessary. This cross coat is only possible if the deposition from the nozzle flat spray pattern can be controlled, which is one of the objectives of the present invention.

I claim:

1. A method of preventing a railroad of fish pattern for conformal coating of a surface comprising:
   (a) pressurizing the coating;
   (b) longitudinally advancing the coating over a surface to be coated, while
   (c) simultaneously feeding the coating onto the surface in a flat spray pattern which reduces tails at the edge of the pattern; and
   (d) continuously triggering "ON/OFF" said feeding, so as to proportion the amount of coating being fed onto the surface in such a manner as to prevent a railroad or fish pattern.

2. Method of conformal coating of a surface as in claim 1, wherein said triggering is at a speed such that the tails of the flat spray pattern are constantly moving inwardly and outwardly.

3. Method of conformal coating of a surface as in claim 2, wherein said triggering is at a frequency such as to create a zipper pattern of coating being fed on the surface.

4. Method of conformal coating of a surface as in claim 2, wherein said triggering is in the range 10 to 60 cycles per second.

5. Method of conformal coating of a surface as in claim 4, wherein said triggering is such that the zipper pattern of coating induces laminar flow together of coating on the surface after application.

6. Method of conformal coating of a surface as in claim 3, wherein the triggering "OFF" mode is in the range 25 to 75% of feeding coating.

7. Method of conformal coating of a surface as in claim 3, wherein said triggering "ON" mode is more than 50% of feeding.

8. Method of conformal coating of a surface as in claim 3, wherein said triggering "ON" mode is approximately twice as long as triggering "OFF" mode.

9. Method of conformal coating of a surface as in claim 3, including transversely advancing the coating over the surface to be coated, so as to eliminate shadowing.

10. Method of conformal coating of a surface as in claim 1, including heating said coating so as to contact said feeding.

11. Method of conformal coating of a surface as in claim 1, wherein said heating of coating utilizes heat generated by said triggering feeding "ON/OFF".

* * * * *